US011336171B2

(12) United States Patent
Poveda Lerma et al.

(10) Patent No.: US 11,336,171 B2
(45) Date of Patent: May 17, 2022

(54) POWER CONVERTER WITH COLD START-UP AND COLD START-UP METHOD FOR POWER CONVERTER

(71) Applicant: Power Electronics España, S.L., Paterna (ES)

(72) Inventors: Antonio Poveda Lerma, Paterna (ES); Abelardo Salvo Lillo, Paterna (ES); David Salvo Lillo, Paterna (ES)

(73) Assignee: Power Electronics España, S.L., Paterna (ES)

( * ) Notice: Subject to any disclaimer, the term of this patent is extended or adjusted under 35 U.S.C. 154(b) by 0 days.

(21) Appl. No.: 16/956,153

(22) PCT Filed: Dec. 18, 2018

(86) PCT No.: PCT/ES2018/070810
§ 371 (c)(1),
(2) Date: Jun. 19, 2020

(87) PCT Pub. No.: WO2019/122481
PCT Pub. Date: Jun. 27, 2019

(65) Prior Publication Data
US 2021/0111623 A1    Apr. 15, 2021

(30) Foreign Application Priority Data

Dec. 20, 2017    (ES) .............................. ES201731438

(51) Int. Cl.
*H02M 1/36*    (2007.01)
*H02J 9/06*    (2006.01)
*H02M 7/493*    (2007.01)

(52) U.S. Cl.
CPC ................. *H02M 1/36* (2013.01); *H02J 9/06* (2013.01); *H02M 7/493* (2013.01)

(58) Field of Classification Search
CPC ............. H02M 1/36; H02M 7/493; H02J 9/06
USPC .......................................................... 307/52
See application file for complete search history.

(56) References Cited

U.S. PATENT DOCUMENTS

| | | | |
|---|---|---|---|
| 2013/0155735 | A1 | 6/2013 | Ilic et al. |
| 2015/0122309 | A1 | 5/2015 | Agraz Huitron et al. |
| 2015/0145336 | A1 | 5/2015 | Paquin et al. |
| 2015/0295511 | A1 | 10/2015 | Veeraraghavan et al. |

(Continued)

FOREIGN PATENT DOCUMENTS

| | | |
|---|---|---|
| CN | 105827131 A | 8/2016 |
| EP | 3010110 A1 | 4/2016 |

*Primary Examiner* — Hal Kaplan
(74) *Attorney, Agent, or Firm* — The Webb Law Firm

(57) ABSTRACT

The present invention discloses a converter with cold start-up and a cold start-up method for modular power converters that allows converter operation tests to be carried out without a connection to the AC grid. For that purpose, the control module powers the power converter modules, disconnects the power converter from the AC grid, selects a power converter module as the AC-source module and configures a voltage and a frequency for the AC-source module, selects the power for the other power converter modules and sets starting conditions. Previously, the control module is powered by an AC source that can be internal or external, such as an uninterruptible power supply (UPS) or a DC source (photovoltaic field), via a DC-AC transformer.

11 Claims, 5 Drawing Sheets

(56) References Cited

U.S. PATENT DOCUMENTS

2016/0322917 A1 11/2016 Matsuoka et al.
2018/0097452 A1* 4/2018 Chapman ............... H02J 3/383

* cited by examiner

POWER CONVERTER WITH COLD START-UP AND COLD START-UP METHOD FOR POWER CONVERTER

CROSS-REFERENCE TO RELATED APPLICATIONS

This application is the United States national phase of International Application No. PCT/ES2018/070810 filed Dec. 18, 2018, and claims priority to Spanish Patent Application No. P201731438 filed Dec. 20, 2017, the disclosures of which are hereby incorporated by reference in their entirety.

SUMMARY OF THE INVENTION

Field of the Invention

The present invention relates to a power converter with cold start-up and a cold start-up method for power converters. The power converters must be modular, i.e., they must be made up of two or more power converter modules. By means of the present invention, it is possible to test the grid synchronization of the converter and/or test the full-power operation of the power converter without the power converter having to be connected to the grid. In other words, by means of the present invention power converters can be tested once they are deployed in the installation wherein they will operate, but before the start-up of the installation.

The technical field of the invention is comprised in the field of power converters, motor controllers, and solar and wind power generation systems.

Background of the Invention

The problem to be solved relates to the fact that those tests that are essential for validating the operation of the power converters cannot be carried out if there is no AC grid voltage. Therefore, the tests which are performed in the power converter without the converter being connected to the AC grid are known as "cold start-up". The availability of an AC voltage source to enable these tests to be carried out is a conditioning aspect which is outside the scope of the equipment provider and depends on other agents intervening in the deployment/installation process.

This problem is described in patent documents like the patent application document with publication number US 2015122309 A1 which highlights that the grid connection for performing tests on the power converter involves significant costs, known as "commissioning costs".

The present invention solves the preceding problem by allowing the grid synchronization of the converter and/or the full-power operation of the power converter to be tested without the power converter having to be connected to the grid.

DESCRIPTION OF THE INVENTION

A first aspect of the invention discloses a power converter with cold start-up. The power converter with cold start-up comprises:
  at least two power converter modules;
  a DC bus connecting the power converter modules with a DC source via a DC switch;
  an AC bus connecting the power converter modules with an AC grid via an AC switch;
  an auxiliary AC power supply with an input that can be connected to an AC source and an output connected to at least the two power converter modules and a control module;
  an auxiliary transformer connected with the AC bus and with the auxiliary AC power supply via a switch;
  the control module connected by means of data connection to at least the power converter modules, to the DC switch, to the AC switch, and to the switch; wherein the control module additionally comprises control setpoints for at least the power converter modules, the DC switch, the AC switch, and the switch;
such that the control module by means of the control setpoints:
  powers the power converter modules by means of the connection with the AC source and the connection with the DC source (closure of the DC switch);
  disconnects the power converter from the AC grid (by means of the opening of the AC switch if it is closed);
  selects a power converter module as the AC source module and configures a voltage and a frequency for the AC source module;
  selects the power for the other power converter modules; and,
  sets starting conditions.

In one embodiment of the invention, the AC source is selected from an uninterrupted power system "UPS" and a DC/AC transformer powered by the DC source. The converter may additionally comprise a soft charge circuit arranged in the connection between the DC bus and the DC source. The soft charge circuit may comprise at least one fuse arranged in series with two resistors and a switch in one of the phases thereof, and a fuse in another of the phases thereof.

In another embodiment of the invention, each power converter module comprises a control stage and a power stage. The power stage may comprise fuses, capacitors, semiconductor devices, contactors and filters.

In another embodiment of the invention, the control module selects the voltage and the frequency for the AC source module by means of pulse width modulation "PWM".

The starting conditions are determined by the type of test to be performed. A "synchronization test" and/or a "full-power test" are usually performed. The full-power test consists of testing all the modules by injecting a maximum current, some modules with a positive setpoint and others with a negative setpoint, such that the total current circulation is zero. It differs from the synchronization test in that, in the synchronization test, the current injected by the modules which are configured as inverters is limited to the maximum power the module acting as the AC source can absorb, whereas there is no limitation in the full-power test. Furthermore, if the pulse width modulation "PWM" is used, the power converter bridges are operated in order to cause the voltage transformation, which consists of comparing a carrier with a modulator, such that the commutating elements are in one position or another depending on the result of this comparison. Given that the power converter is modular, all the power converter bridges must be synchronized, i.e., they must trigger with the least possible time difference, preventing current recirculation between modules.

Therefore, by means of the present invention it is possible to replace the power supply provided by the AC grid, which is characterised by providing high current and voltage values (high voltage with voltage values greater than or equal to 100 kV), by an AC power supply ("AC source" in the present invention), or by a DC power supply with transformation to AC by means of the low-voltage DC/AC transformer (voltage less than 1000 V) for powering the control stage and the power stage of the converter modules, as well as the control module.

A second aspect of the invention discloses a cold start-up method for power converters. The cold start-up method for power converters, wherein the power converter comprises at least one control module, an AC source (internal or external, such as a UPS or the DC source to which a DC/AC transformer is connected), and two power converter modules.

The method is characterized in that it comprises:
- A) powering at least the control module and the power converter modules;
- B) disconnecting the power converter from an AC grid;
- C) configuring parameters of the power converter modules:
  - i) selecting a power converter module as the AC source: AC source module;
  - ii) configuring the voltage of the AC source module to the rated voltage of the power converter;
  - iii) configuring the rated frequency of the power converter to the frequency of the AC grid;
  - iv) establishing the power of the other power converter modules;
- D) setting starting conditions; thereby starting the "cold start-up" operation; and,
- E) verifying the start of all the modules and the synchronization thereof.

In one embodiment of the invention, the cold start-up method for power converters may additionally comprise stopping the other power converter modules, and then stopping the AC source module, once the operation of the power converter has been verified. Optionally, sub-step iv) additionally comprises establishing the power of the other power converter modules such that the sum of power provided by the other power converter modules is less than or equal to the maximum absorbed power of the AC source module when a power converter start-up and synchronization test is required.

DETAILED DESCRIPTION OF THE INVENTION

An embodiment of the invention is described below in an illustrative and non-limiting manner.

Figure 1:
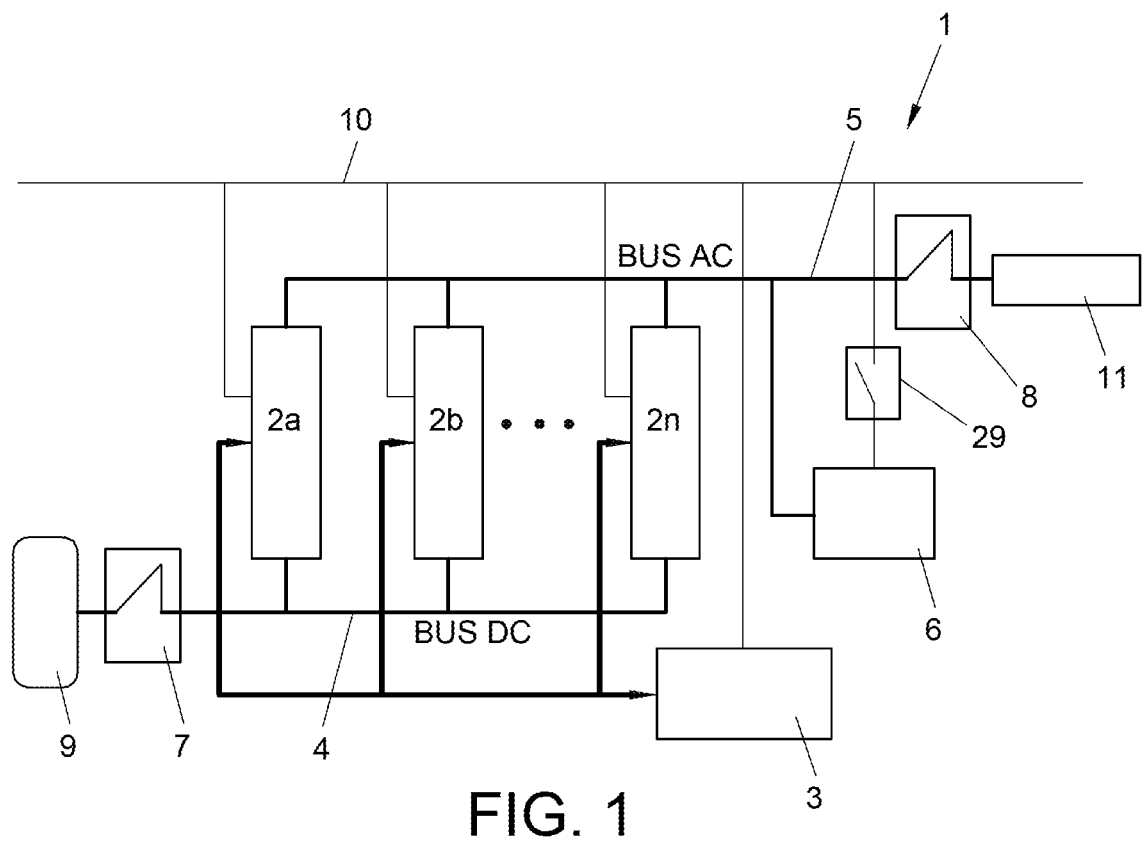
FIG. 1 shows a modular power converter of the state of the art.
Figure 2:
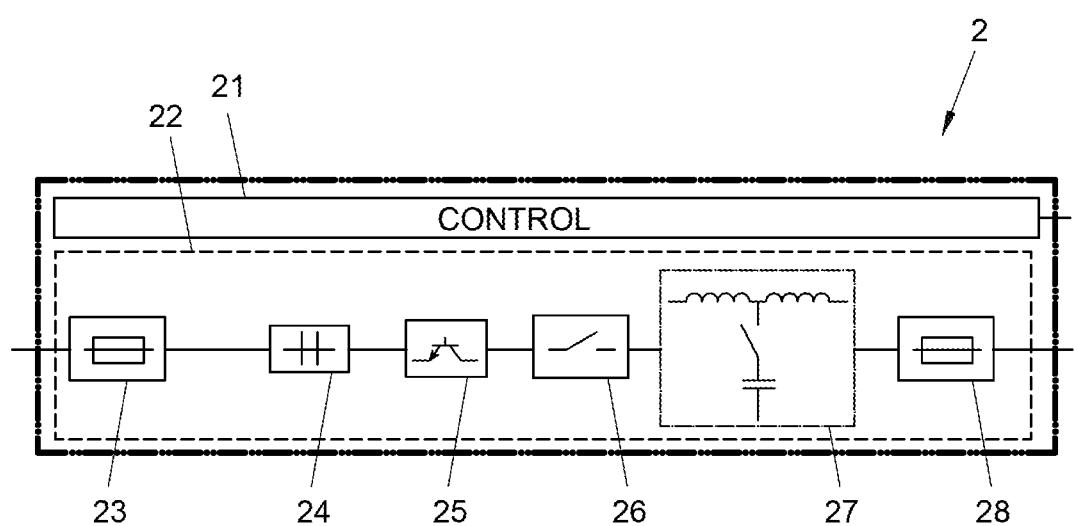
FIG. 2 shows a block diagram of a power converter module of a power converter like the one shown in FIG. 1.

The present invention is applicable to modular power converters like the one shown in FIG. 1. The modular power converter 1 shown in FIG. 1 comprises: n inverter modules 2a-2n; the DC bus 4 connecting all the inputs of the n inverter modules 2a-2n to the DC source 9 via the DC switch 7; the AC bus 5 connecting all the outputs of the n inverter modules 2a-2n to the AC grid 11 via the AC switch 8; the auxiliary transformer 6 which is powered by the AC bus 5 and powers the auxiliary AC power supply 10 via a switch (29); a control module 3 connected to the n inverter modules 2a-2n by means of data connection for controlling the n inverter modules 2a-2n. The auxiliary AC power supply 10 connects the output of the auxiliary transformer 6 (via a switch (29)) with the inputs of the n inverter modules 2a-2n and with the control module 3 for powering same. It must be taken into account that the n inverter modules 2a-2n have two electrical inputs, a DC current input through the DC bus 4 which will be converted by each power converter module into an AC current at the output of the power converter module, specifically in the AC bus, by means of the power stage 22 (see FIG. 2) and another AC current input which powers the control stage 21 comprised in each power converter module (see FIG. 2). Therefore, the auxiliary transformer 6 is an AC/AC transformer which transforms the AC voltage of the AC bus 5 to the AC voltage required by the control stage 21 and the control module 3. In other words, as shown in FIG. 2, a power converter module 2, which can be any one of the n inverter modules 2a-2n shown in FIG. 1, comprises the control stage 21 and the power stage 22. The power stage 22 carries out power conversion. In other words, it is the power stage 22 that performs the DC/AC conversion. In the particular case of photovoltaic solar inverters, it would consist of the conversion of the DC current coming from the photovoltaic field into AC current. The power stage 22 of the converter modules 2a-2n comprises switching electronics formed by semiconductor devices 25 and other elements, mainly capacitors 24, filters 27, contactors 26, and protections 23, 28. The power stage 22 of the inverter modules may include a soft charge circuit to prevent current peaks inherent to the powering of the components during the first instants in which power is provided to the power converter. This soft charge circuit (similar to that shown in FIG. 6) basically consists of a series of resistors limiting the absorbed current and the effect of which is cancelled through a bypass once the system is powered. In turn, the control stage 21 is in charge of controlling the elements (23-28) contained in the power stage 22. The control stage 21 receives control setpoints from the control module (see FIG. 3).

Figure 4:
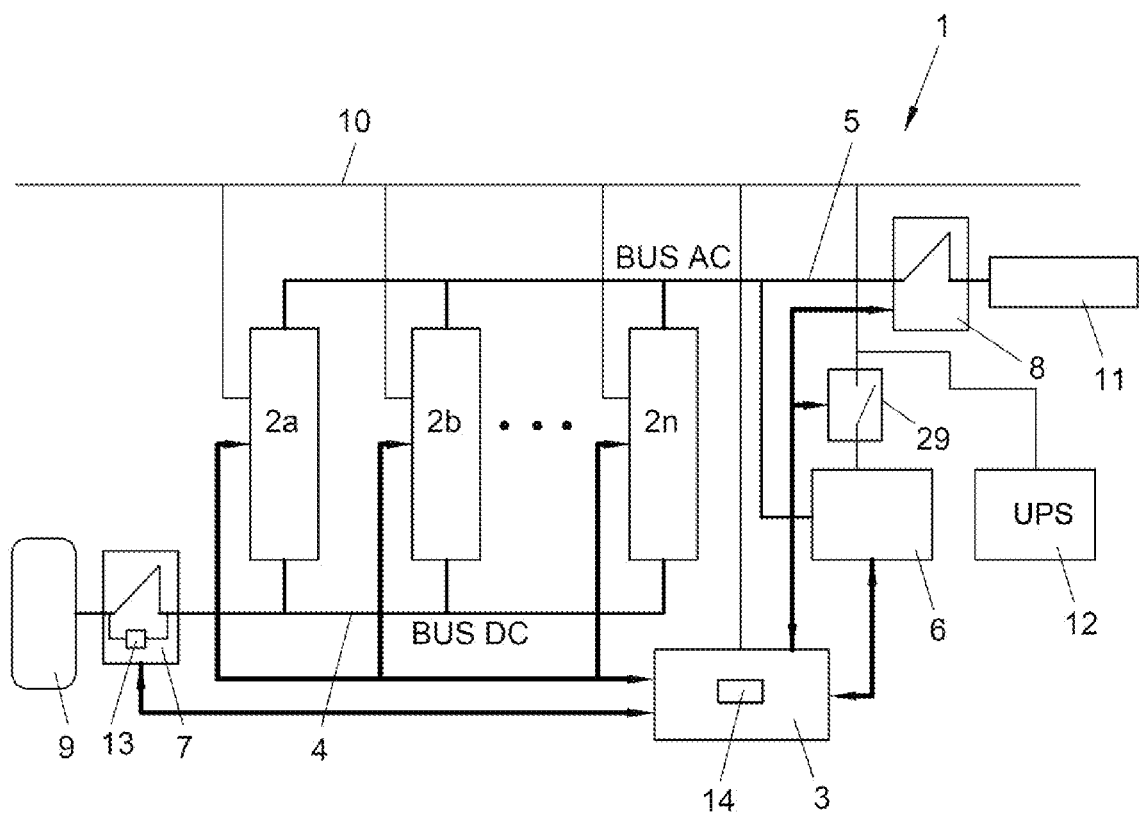
FIG. 4 shows a power converter with cold start-up of the present invention connected to an uninterrupted power system UPS.

FIG. 4 shows an embodiment of the power converter with cold start-up. The modular power converter 1 shown in FIG. 4 comprises: the n inverter modules 2a-2n; the DC bus 4 connecting all the inputs of the n inverter modules 2a-2n to the DC source 9 via the DC switch 7; the AC bus 5 connecting all the outputs of the n inverter modules 2a-2n to the AC grid 11 via the AC switch 8; the auxiliary transformer 6 powers the auxiliary AC power supply 10 via a switch 29; the control module 3 connected to the n inverter modules 2a-2n by means of data connection for controlling the n inverter modules 2a-2n. The auxiliary AC power supply 10 connects the output of the auxiliary transformer 6, via a switch 29, with the inputs of the n inverter modules 2a-2n and with the control module 3 for powering same. The control module 3 is additionally connected to the switches 7, 8, and 29 for the connection/disconnection thereof. Unlike the power converter of FIG. 1, the converter of FIG. 4 initializes the control stages 21 and the control module 3 by means of uninterrupted power system ("UPS") 12. The uninterrupted power system ("UPS") 12 can be internal to the modular power converter 1 or it can be external to the converter 1. Given that the converter 1 is initially isolated from the DC source 9 and the grid 11, the UPS 12 is used to initialize ("start") the power converter 1. Once the control module 3 is powered (i.e., started or initialized), the control module 3 can carry out the cold start-up of the power converter 1. To that end, it sends control setpoints 14 to the other components of the power converter in the following manner: it powers the power converter modules (2a-2n) by means of the connection with the DC source 9 (closure of the DC switch 7) and the connection with the UPS 12 (switch 29 open by default); it disconnects the power converter from the AC grid 11 (by means of the opening of the AC switch 8 if it is closed); it selects a power converter module (for example, 2a) as the AC source module and configures a voltage and a frequency for the AC source module; it selects a power for the other power converter modules (following the example, 2b-2n); and it sets starting conditions. The order for sending the setpoints does not necessarily need to be the one indicated. The starting conditions refer to the voltage and frequency levels that must be had in the busbars (DC bus, AC bus) for the start-up of the power converter modules. The minimum and maximum values are configured by parameter.

Figure 5:
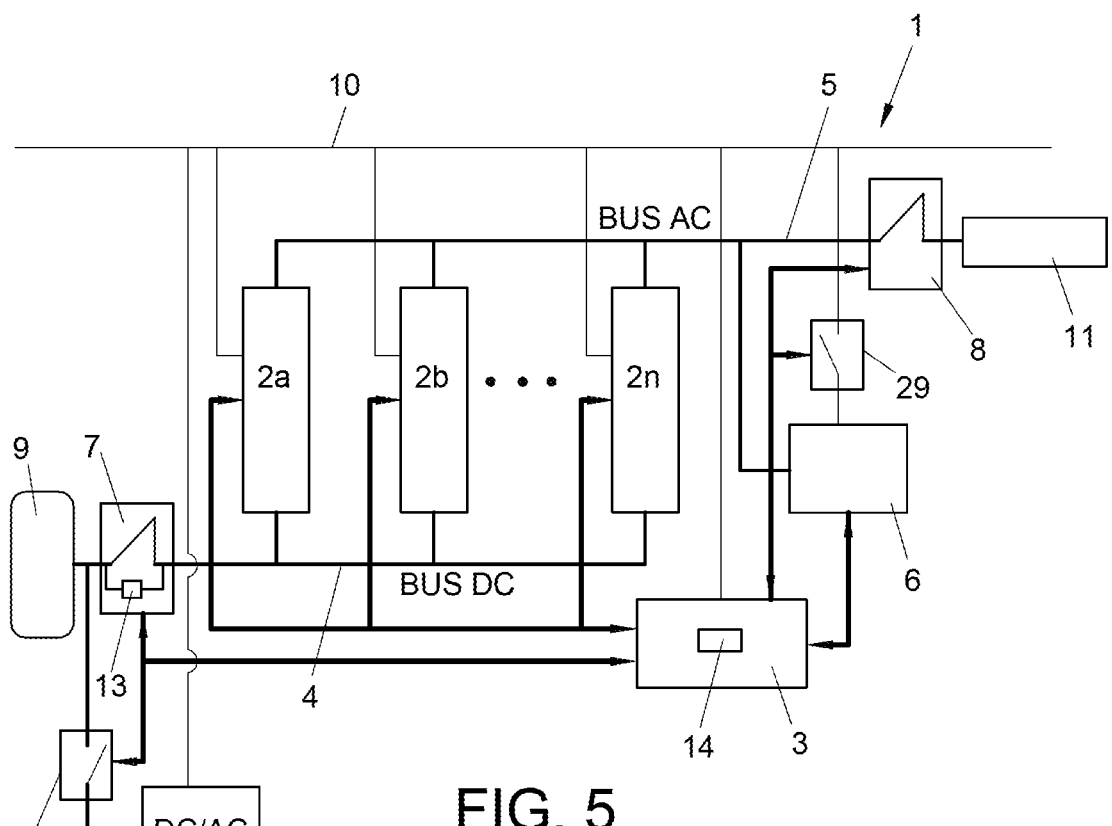
FIG. 5 shows a power converter with cold start-up of the present invention connected to a DC source via a DC/AC transformer.

Moreover, FIG. 5 shows another embodiment of the power converter with cold start-up of the present invention. The modular power converter 1 shown in FIG. 5 comprises: the n inverter modules 2a-2n; the DC bus 4 connecting all the inputs of the n inverter modules 2a-2n to the DC source 9 via the DC switch 7; the AC bus 5 connecting all the outputs of the n inverter modules 2a-2n to the AC grid 11 via the AC switch 8; the auxiliary transformer 6 powers the auxiliary AC power supply 10 via a switch 29; the control module 3 connected to the n inverter modules 2a-2n by means of data connection for controlling the n inverter modules 2a-2n. The auxiliary AC power supply 10 connects the output of the auxiliary transformer 6, via a switch 29, with the inputs of the n inverter modules 2a-2n and with the control module 3 for powering same. The control module 3 is additionally connected to the switches 7, 8, and 29 for the connection/disconnection thereof. Unlike the power converter of FIG. 1, the converter of FIG. 5 initializes the control stages 21 and the control module 3 by means of the DC/AC transformer 18 which is powered by the DC source 9 and powers the auxiliary AC power supply 10 by means of respective electrical connections. The DC/AC transformer 18 can be internal to the modular power converter 1 itself or can be external to the converter 1. Given that the converter 1 is initially isolated from the DC source 9 and the grid 11, the DC/AC transformer 18, which is a low-current transformer that therefore has a small size in comparison with the solar inverters 2 or the auxiliary transformer 6, is used to initialize ("start") the power converter 1. Once the control module 3 is powered (i.e., started or initialized), the control module 3 can carry out the cold start-up of the power converter 1. To that end, it sends control setpoints 14 to the rest of the components of the power converter in the following manner: it powers the power converter modules (2a-2n) by means of the dual connection with the DC source 9 by means of the closure of the DC switch (7) and the closure of the switch 18a; it disconnects the power converter from the AC grid 11 (by means of the opening of the AC switch 8 if it is closed); it selects a power converter module (for example, 2a) as the AC source module and configures a voltage and a frequency for the AC source module; it selects a power for the rest of the power converter modules (following the example, 2b-2n); and it sets starting conditions. The order for sending the setpoints does not necessarily need to be the one indicated. The starting conditions refer to the voltage and frequency levels that must be had in the busbars (DC bus, AC bus) for the start-up of the power converter modules. The minimum and maximum values are configured by parameter.

Similarly to how the power stage 22 of the inverter modules may include a soft charge circuit to prevent current peaks inherent to the powering of the components during the first instants in which power supply is provided to the power converter, the power converter may comprise a soft charge circuit 13 between the current input and the DC source 9. For simplicity, the soft charge circuit 13 is shown in FIGS. 4 and 5 as an integral part of the DC switch 7 (also referred to as connection/disconnection unit), but it could be an element per se interposed between the DC source 9 and the DC bus 4.

Figure 6:
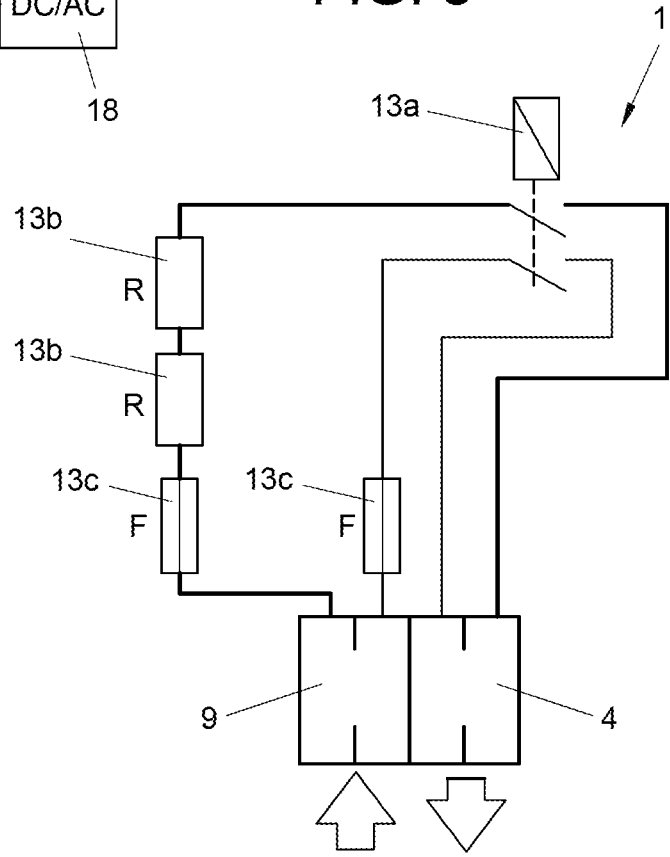
FIG. 6 shows the soft charge circuit comprised in the power converter with cold start-up of the present invention.

A possible implementation of the soft charge circuit 13 is shown in FIG. 6 and is formed by a fuse 13c arranged in series with two resistors 13b and a switch 13a for one of the phases thereof. The soft charge circuit 13 may comprise another fuse 13c in another of the phases thereof.

A relevant aspect for the present invention is the modulation of the bridge of the power converter 1, which refers to the pattern it will follow in order to carry out the opening/closure of the switches 26, such that the sine waveform 17 (see FIG. 7) is generated at the output of the inverter. The switching sequence followed by the switches is imposed by a prior modulation process which will determine the features of the output signal including, among others: form, amplitude, frequency, and harmonic content. There are several modulation techniques for controlling three-phase power converters, with pulse width modulation (PWM) being one of the most commonly used techniques.

Figure 7:
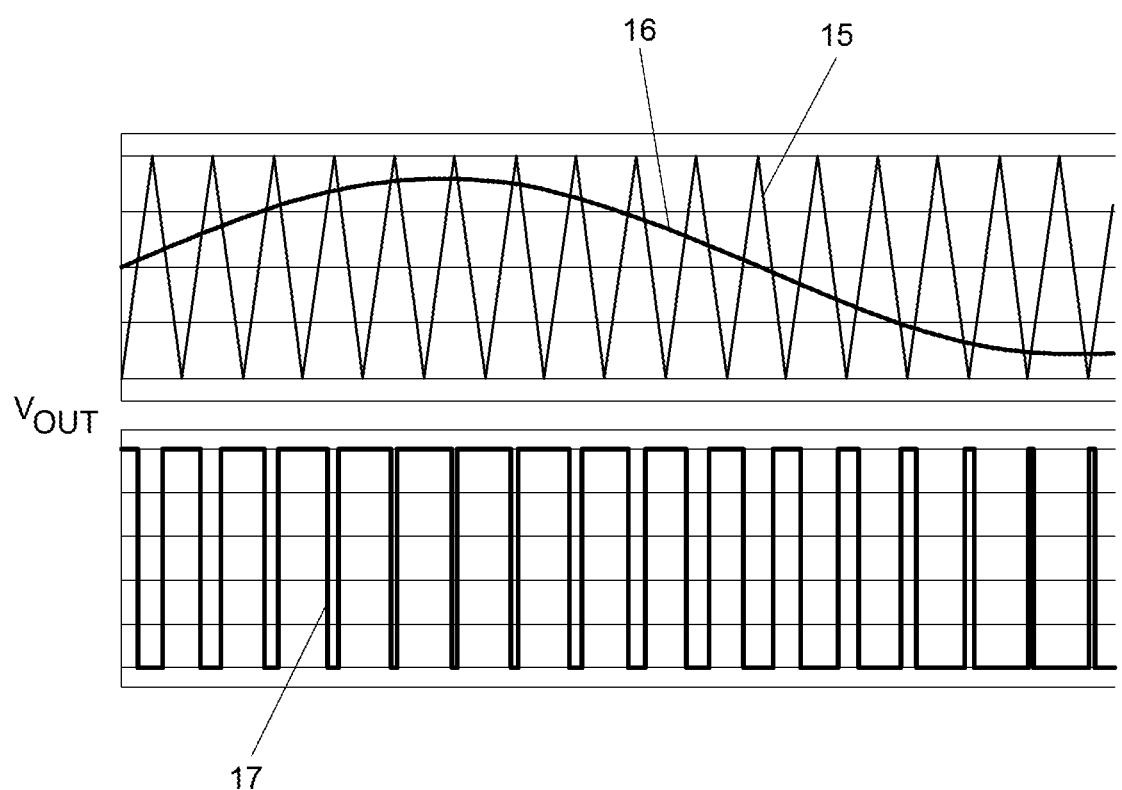
FIG. 7 shows a signal modulated by means of PWM (Pulse Width Modulation) from a carrier wave and another modulating wave.

All the modulation techniques have in common the use of a trigger signal or carrier signal 15 (see FIG. 7), and a reference signal or modulating signal 16 (see FIG. 7). The modulating signal 16 contains the information to be transmitted. In this aspect, the modulating signal 16 will represent the phase voltage signal that is to be obtained at the output of the power converter 1, maintaining the same frequency, but with a much lower voltage level. Moreover, the carrier signal 15 is a signal having a high frequency and fixed voltage level with generally triangular or saw tooth profiles. This signal imposes the switching frequency of the transistors.

The PWM consists of comparing the modulating signal 16 and the carrier signal 15, such that the pulse at the output has one value or another depending on the results of this comparison (the modulating signal being greater or less than the carrier signal). Therefore, varying the pulse width of a squared voltage signal is achieved, being able to control the amount of administered power. The operation of two-level PWM is described by way of example below. This modulation is the simplest conceptually, and the present invention does not limit the type of modulation used. In order to guarantee the correct operation of the set of power converter modules (2a-2n) of the power converter, it must be ensured that all the modules (2a-2n) trigger with the least possible time difference, preventing current recirculation between modules, which are therefore synchronized.

The function of the control stage 21 is to monitor the DC current and bus voltage values at the input of the power converter module 2, the intensity at the output of the switching device 25, and the temperature of the set of switching electronics 25, 27.

These records enable the state of the power converter module 2 to be managed, providing the signals for triggering the commutating electronics and the orders for opening/closing the DC and AC switches, the filter, the soft charge circuit, and additionally the ventilation system.

Figure 3:
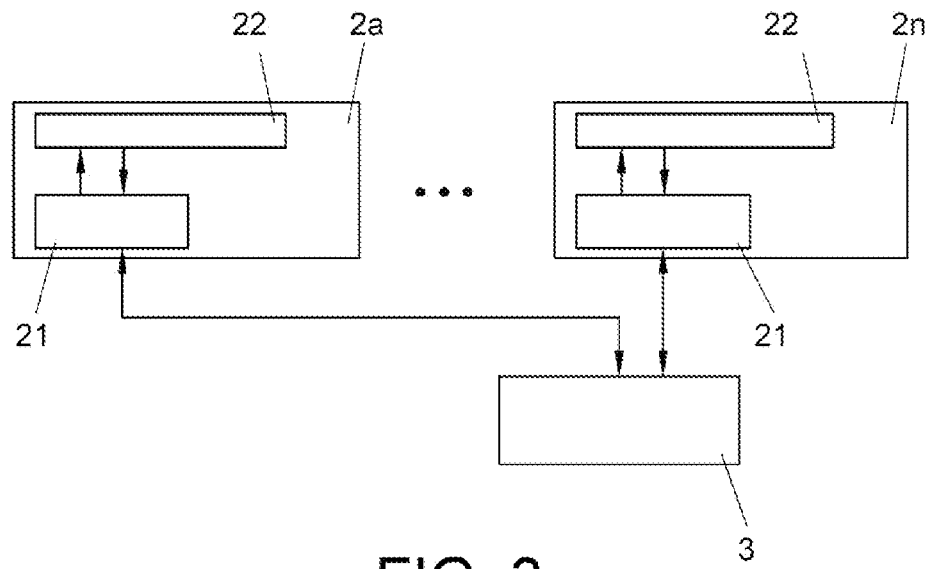
FIG. 3 shows a block diagram in which the data communication between the control module and the power converter modules of a power converter.

The control stage 21 of the power converter module 2 also incorporates communication with the control module 3 of the power converter 1, through which it sends the current measurements in real time (see FIG. 3).

With the power converter with cold start-up described above, at least one grid synchronization and power converter start-up test, as well as a full power converter test, can be performed.

Figure 8:
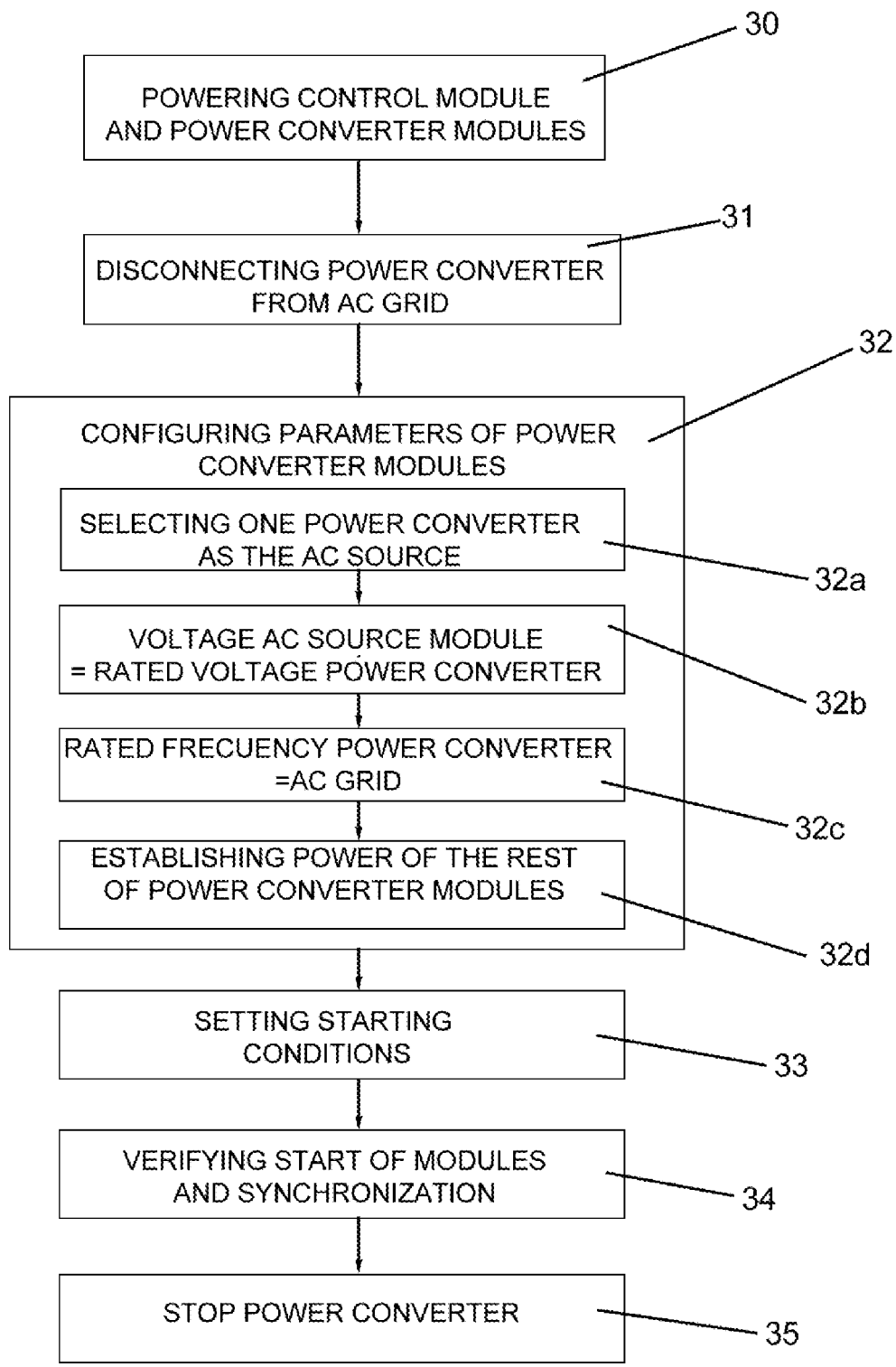
FIG. 8 shows a flowchart of the cold start-up method according to the present invention.

To achieve the foregoing, FIG. 8 shows a flowchart of the method of the present invention applied to a power converter comprising at least one control module, an AC source (internal or external, such as a UPS or the DC source to which a DC/AC transformer is connected), and two power converter modules. Optionally, the power converter could comprise all the elements and in the configuration disclosed above. The method for carrying out any of the preceding tests comprises the following steps:

A) powering 30 at least the control module and the power converter modules; to do so, the control module is connected to the AC source and the power converter module to the AC source (for powering the control stage) and to the DC source (for powering the power stage);

B) disconnecting 31 the power converter from an AC grid;

C) configuring 32 parameters of the power converter modules:
   i) selecting 32a a power converter module as the AC source: AC source module;
   ii) configuring 32b the voltage of the AC source module to the rated voltage of the power converter; (this configuration must be carried out before the start-up of the other modules; to do so, the voltage of the module of the AC source is adjusted until it corresponds with that of the power converter);
   iii) configuring 32c the rated frequency of the power converter to the frequency of the AC grid;
   iv) establishing 32d the power of the other power converter modules;

D) setting 33 starting conditions; thereby starting the "cold start-up" operation;

E) verifying 34 the start of all the modules and the synchronization thereof.

With the preceding steps, the power converter would be in operation to enable being verified without having to be connected to the AC grid. In order to stop 35 the operation of the power converter, it must be performed in a suitable manner. To that end, the method additionally comprises first stopping the other power converter modules, and then stopping the AC source module, once the operation of the power converter has been verified.

If a power converter start-up and synchronization test is required, the method establishes the power of the other power converter modules such that the sum of power provided by the other power converter modules is less than or equal to the maximum absorbed power of the AC source module.

If a full power converter test is required, the method establishes the power of the other power converter modules at the rated value of each of them such that one half of the other power converter modules generate current with a positive sign and the other half of the other power converter modules generate current with a negative sign.

The invention claimed is:

1. A power converter with cold start-up, comprising:
at least two power converter modules;
a DC bus connecting the power converter modules with a DC source via a DC switch;
an AC bus connecting the power converter modules with an AC grid via an AC switch;
an auxiliary AC power supply with an input that can be connected to an AC source and an output connected to at least the two power converter modules and a control module;
an auxiliary transformer connected with the AC bus and with the auxiliary AC power supply via an auxiliary switch;
the control module connected through a data connection to at least the power converter modules, to the DC switch, to the AC switch, and to the auxiliary switch; wherein the control module additionally comprises control setpoints for at least the power converter modules, the DC switch, the AC switch, and the auxiliary switch;
such that the control module, by means of the control setpoints:
powers the power converter modules by means of the connection with the AC source and the connection with the DC source;
disconnects the power converter from the AC grid;
selects a power converter module as the AC source module and configures a voltage and a frequency for the AC source module;
selects a power for the other power converter modules; and,
sets starting conditions.

2. The power converter with cold start-up according to claim 1, wherein the AC source is selected from:
an uninterrupted power system "UPS"; and,
a DC/AC transformer powered by the DC source.

3. The power converter with cold start-up according to claim 2, wherein the converter additionally comprises a soft charge circuit arranged in the connection between the DC bus and the DC source.

4. The power converter with cold start-up according to claim 3, wherein the soft charge circuit comprises at least one fuse arranged in series with two resistors and a switch in one of the phases thereof, and a fuse in another of the phases thereof.

5. The power converter with cold start-up according to claim 1, wherein each power converter module comprises a control stage and a power stage.

6. The power converter with cold start-up according to claim 5, wherein the power stage comprises fuses, capacitors, semiconductor devices, contactors, and filters.

7. The power converter with cold start-up according to claim 1, wherein the control module selects the voltage and the frequency for the AC source module by means of pulse width modulation "PWM".

8. A cold start-up method for a power converter, wherein the power converter comprises at least one control module, an AC source, and two power converter modules, the method comprising:
   A) powering at least the control module and the power converter modules;
   B) disconnecting the power converter from an AC grid;
   C) configuring parameters of the power converter modules:
      i) selecting one power converter module as an AC source module;
      ii) configuring the voltage of the AC source module to a rated voltage of the power converter;
      iii) configuring a rated frequency of the power converter to the frequency of the AC grid;
      iv) establishing the power of the other power converter modules;
   D) setting starting conditions; thereby starting a "cold start-up" operation; and,
   E) verifying the start of all the modules and the synchronization thereof.

9. The cold start-up method for the power converter according to claim 8, wherein the method additionally comprises stopping the other power converter modules, and then stopping the AC source module once the operation of the power converter has been verified.

10. The cold start-up method for the power converter according to claim 8, wherein sub-step iv) additionally comprises establishing the power of the other power converter modules such that the sum of power provided by the other power converter modules is less than or equal to a maximum absorbed power of the AC source module when a power converter start-up and synchronization test is required.

11. The cold start-up method for the power converter according to claim 8, wherein sub-step iv) additionally comprises establishing the power of the other power converter modules at the rated value of each of them such that one half of the other power converter modules generate current with a positive sign and the other half of the other power converter modules generate current with a negative sign when a full power converter test is required.

* * * * *